(12) United States Patent
Gillette et al.

(10) Patent No.: US 12,231,128 B2
(45) Date of Patent: ***Feb. 18, 2025

(54) FREQUENCY SELECTIVE LIMITER HAVING REDUCED SPIKE LEAKAGE

(71) Applicant: Metamagnetics, Inc., Marlborough, MA (US)

(72) Inventors: Scott M. Gillette, Norfolk, MA (US); Mahima Shukla, Marlborough, MA (US)

(73) Assignee: Metamagnetics, Inc., Marlborough, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/462,482

(22) Filed: Sep. 7, 2023

(65) Prior Publication Data

US 2024/0072780 A1     Feb. 29, 2024

Related U.S. Application Data

(63) Continuation of application No. 17/490,865, filed on Sep. 30, 2021, now Pat. No. 11,791,809.

(60) Provisional application No. 63/085,532, filed on Sep. 30, 2020.

(51) Int. Cl.
*H03K 5/08* (2006.01)
*H01P 1/00* (2006.01)

(52) U.S. Cl.
CPC .................................. *H03K 5/08* (2013.01); *H01P 1/00* (2013.01)

(58) Field of Classification Search
None
See application file for complete search history.

(56) References Cited

U.S. PATENT DOCUMENTS

| 10,404,242 B1 | 9/2019 | Lappe et al. |
| 10,707,547 B2 | 7/2020 | Morton |
| 11,349,185 B1 * | 5/2022 | Geiler .................. H01P 11/007 |
| 11,588,218 B1 | 2/2023 | Morton |
| 11,791,809 B2 | 10/2023 | Gillette et al. |

OTHER PUBLICATIONS

Geiler, Michael et al., "Microwave Magnetics and Considerations for Systems Design"; IEEE Journal of Microwaves; Jan. 7, 2021; 9 Pages.
Shojaei-Asanjan, Desireh, "RF MEMS-Based Frequency Dependent Power Limiters"; University of Waterloo, Jan. 2018; 98 Pages.
Stitzer, Steven N., "Spike Leakage and Suppression in Frequency Selective Limiters"; IEEE MTT-S International Microwave Symposium Digest, Jun. 2000; 4 Pages.
Response to 3.12 Amendment dated Aug. 15, 2023 for U.S. Appl. No. 17/490,865; 2 Pages.

(Continued)

*Primary Examiner* — Cassandra F Cox
(74) *Attorney, Agent, or Firm* — Daly, Crowley, Mofford & Durkee LLP

(57) ABSTRACT

Described is a frequency selective limiter (FSL) module comprising a cascade of an FSL and a functional limiter (e.g. a conventional semiconductor limiter comprising a PIN diode) with steady state limiting and power threshold values selected such the FSL module provides suppression of a spike leakage power and while still enabling frequency selective limiting.

31 Claims, 11 Drawing Sheets

(56) References Cited

OTHER PUBLICATIONS

Rule 3.12 Amendment dated Jun. 21, 2023 for U.S. Appl. No. 17/490,865; 7 Pages.
Notice of Allowance dated Jun. 14, 2023 for U.S. Appl. No. 17/490,865; 10 Pages.
Preliminary Amendment dated Nov. 22, 2022 for U.S. Appl. No. 17/490,865; 3 Pages.

* cited by examiner

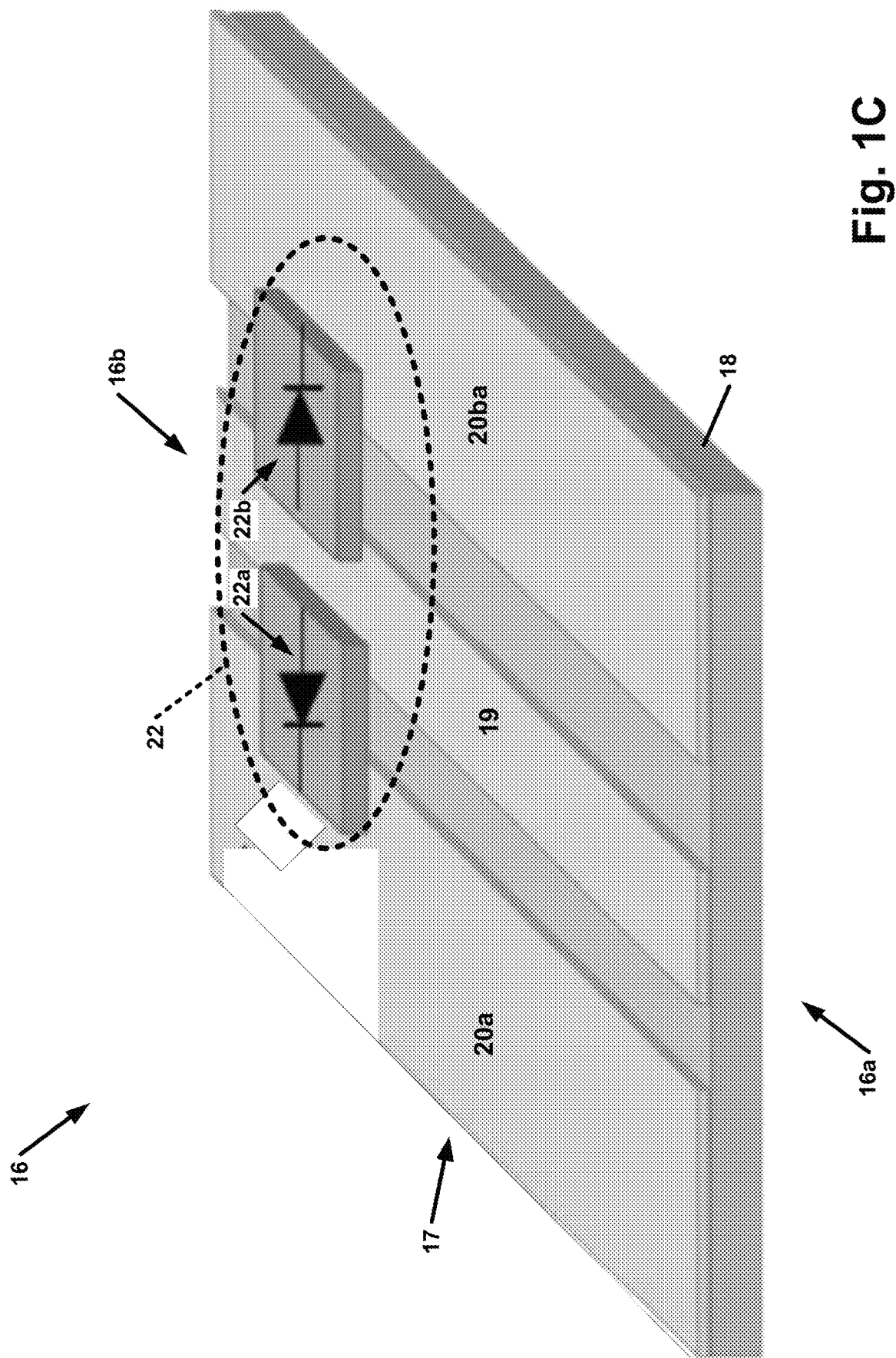

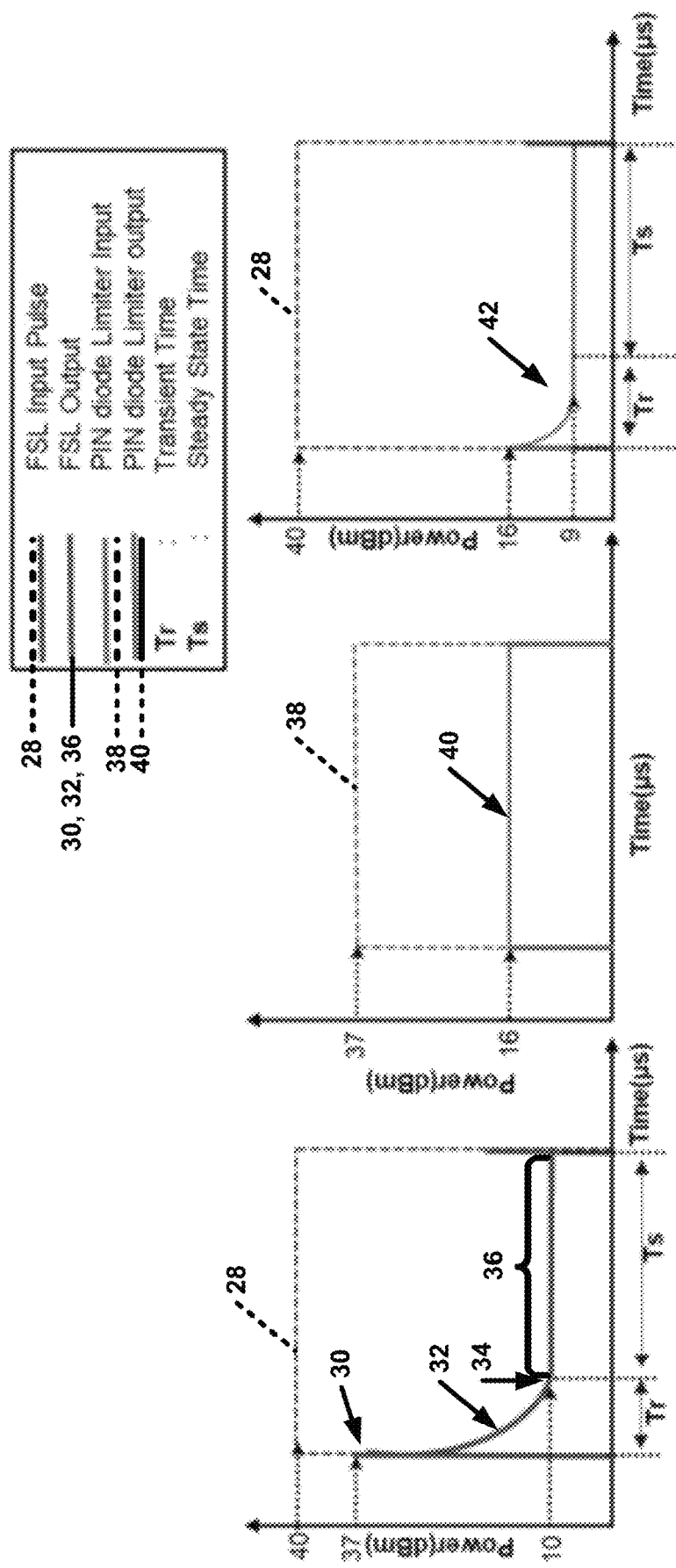

FREQUENCY SELECTIVE LIMITER HAVING REDUCED SPIKE LEAKAGE

RELATED APPLICATIONS

This application is a continuation of U.S. application Ser. No. 17/490,865, filed Sep. 30, 2021, which claims benefit, under 35 U.S.C. § 119(e), of U.S. Provisional Application No. 63/085,532, filed Sep. 30, 2020, the contents of which the applications are incorporated herein by reference in their entireties.

STATEMENT REGARDING FEDERALLY SPONSORED RESEARCH OR DEVELOPMENT

This invention was made with government support under Contract No. N68335-21-C-0197 awarded by the U.S. Navy, Office of Naval Air Warfare Center—Aircraft Division. The government has certain rights in the invention.

BACKGROUND

Ferrite-based frequency selective limiters (FSLs) have the ability to automatically and selectively suppress signals that exceed a designated power threshold while simultaneously allowing for signals below the threshold to pass without attenuation. This functionality is valuable in receiver front ends as a protection component because it allows small signals to be detected while large signals, that could otherwise saturate, overload, disrupt, and/or damage the receiver, are simultaneously and automatically suppressed. The FSL does not need any a priori knowledge of the input spectrum, nor any computerized feedback/control. Its transmission response automatically and dynamically adjusts to the input spectrum based on power spectral density and will automatically generate notches in the transmission response proportional to a signals' supercriticality (i.e. how far a signal is above the designated power threshold). In this way, the FSL is able to automatically and dynamically adapt to a changing input spectrum with exceptional speed.

SUMMARY

In accordance with the concepts, systems, circuit and techniques taught herein, described is a frequency selective limiter (FSL) which reduces (and ideally minimizes) spike leakage associated with ferrite-based FSLs.

In accordance with concepts, systems, circuit and techniques described herein, it has been recognized that ferrite-based FSLs require some amount of time to activate and provide limiting to an above-threshold signal. This response time is typically on the order of 100 nanoseconds. FSL response is an energy-driven process and its transient time will be longer for signals that are marginally supercritical (i.e. above-threshold) and shorter for signals that are strongly supercritical. One drawback to the ferrite-based FSL technology is that the output power will equal input power less linear insertion losses (i.e. conduction, dielectric, magnetic losses) in the short time before the limiting process is established (i.e. response time).

This effect may be referred to as "spike leakage." For an input signal that is strongly supercritical, the spike leakage through the FSL may be strong enough to disrupt and even damage receiver electronics. As such, ways to reduce (and ideally minimize) this spike leakage are beneficial and practical.

The spike leakage is a common problem of high power limiters. In the past, high power limiters such as plasma limiters have used a priming signal to reduce the spike leakage. A simple and bulky approach to reduce FSL spike leakage is the use of delay lines with couplers. This technique "primes" the FSL by using a delayed copy of input signal.

In accordance with the concepts, circuits and methods described herein an FSL module includes a cascade of an FSL and a functional limiter.

With this particular arrangement, an analog based solution for reducing (and ideally minimizing or even eliminating spike leakage in a ferrite-based FSL is provided. A frequency selective limiter module having reduced, minimal, or even no transient output spike leakage may be achieved by cascading a ferrite-based FSL (i.e., a first FSL) with a functional limiter (i.e., a second device which may be a traditional semiconductor limiter device), whereby the power threshold of the functional limiter (e.g., the power threshold of the semiconductor limiter) is above the FSL's steady-state limited output power. In this way, transient spike leakage power is limited by the semiconductor limiter and as the FSL's output power reaches steady state limiting and drops below the functional limiter's power threshold, frequency selective limiting is achieved. Such a circuit may help realize the full benefit ferrite based FSLs can offer in a receiver front-end, for example.

In accordance with a further aspect of the concepts, circuits and methods described herein is a frequency selective limiter module having improved response time. Such an FSL module is achieved by using polycrystalline ferrite materials that exhibit a spinwave linewidth that is higher (or broader) than single crystal materials. Single crystal garnet materials typically exhibit spinwave linewidths below 1 Oe. Polycrystalline materials exhibiting higher spinwave linewidth (1 to 20 Oe) can be used to realize limiting response times which are faster than limiting response times of FSLs utilizing single crystalline materials.

In general, spinwave linewidth represents the Q of the material's ability to provide the non-linear response. Lower spinwave linewidth (narrower) results in higher Q and slower response time. Higher spinwave linewidth (broader) results in lower Q and faster response time. Materials can be chosen based upon response time requirements for a particular application.

In embodiments, polycrystalline materials including, but not limited to: TransTech G-113, G-810, G-1010, G-1210, aluminum doped series (G-1009 thru G-610), Calcium Vanadium Doped series (TTVG-800 thru TTZ1950), and Pacific Ceramics 39-1780A, 39-1780B, 39-1780CX may be used. Other ferrite compositions having characteristics which are the same as or similar to those listed above may, of course, also be used.

In accordance with a further aspect of the concepts, circuits and methods described herein a frequency selective limiter module having a limiting dynamic range which is greater than the limiting dynamic range of a single FSL may be achieved by cascading polycrystalline ferrite FSL, with a single crystal ferrite FSL and a functional limiter (e.g., a traditional semiconductor limiter), wherein the functional limiter is provided having a power threshold which is above a steady state limiting output power of a single FSL or a combination of all FSL stages (some or all of which may be polycrystalline ferrite FSLs and some or all of which may be single crystal ferrite FSLs).

In embodiments, multiple polycrystalline and/or single crystal FSL stages may be employed to achieve a desired limiting dynamic range (i.e. reducing input power by X-dB to achieve Y-dBm output power level).

In accordance with a still further aspect of the concepts, circuits and methods described herein a low-cost, high-power handling, high dynamic range limiter is achieved by cascading a polycrystalline ferrite FSL with a functional limiter (e.g., a traditional semiconductor limiter, whereby the power threshold of the functional limiter is below the steady-state limited output power of the polycrystalline ferrite FSL. Note that in this embodiment, frequency selective limiting function is sacrificed.

In accordance with a still further aspect of the concepts, circuits and methods described herein a hybrid ferrite-based FSL comprises polycrystalline and single crystal materials are used in parallel.

Such an arrangement may be achieved in an assembly process whereby a single crystal and polycrystalline material may be on either side of the FSL circuit (e.g., a coplanar waveguide circuit) such that the EM wave propagates in both materials simultaneously and is processed by both materials differently.

In accordance with a still further aspect of the concepts, circuits and methods described herein a high-power handling ferrite-based FSL embodiment utilizing one or more of: double-ridge wave waveguide loaded with ferrites (including, but not limited to, any of the ferrite materials listed above); rectangular waveguide utilizing ferrites (including, but not limited to, any of the ferrite materials listed above); stripline waveguide utilizing the ferrites (including, but not limited to, any of the ferrite materials listed above); co-planar waveguide utilizing ferrites ((including, but not limited to, any of the ferrite materials listed above); substrate-integrated waveguide utilizing ferrites (including, but not limited to, any of the ferrite materials listed above); microstrip (unloaded and loaded) waveguide utilizing ferrites; (including, but not limited to, any of the ferrite materials listed above); slotline waveguide utilizing ferrites (including, but not limited to, any of the ferrite materials listed above); and coaxial waveguide utilizing ferrites (including, but not limited to, any of the ferrite materials listed above).

DESCRIPTION OF THE SEVERAL VIEWS OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which:

FIG. 1C is an isometric view of an FSL module including a co-planar waveguide FSL having an integrated functional limiter;

FIG. 2A is a plot of FSL output power vs. time illustrating transient and steady state conditions of FSL output;

FIG. 2B is a plot of PIN diode limiter output power vs. time;

FIG. 2C is a plot of output power vs. time for an FSL module comprising an FSL integrated with a PIN diode limiter;

DETAILED DESCRIPTION

Ferrite-based frequency selective limiters (FSLs) have response times on the order of 100 nanoseconds, during which spike leakage occurs and propagates to the output of the FSL. The spike leakage is unwanted. Conventional (non-FSL) limiters (e.g., semiconductor diodes, PIN diode, gas discharge, etc.) have response times typically less than about 1 nanosecond. However, one drawback to such conventional limiter technologies is that they attenuate all signals uniformly when activated.

Described herein are FSL modules comprising a cascade of an FSL and a functional limiter. Such FSL modules are suitable for use with radio frequency (RF) signals having frequencies in the range of about 1 MHz to about 100 GHz.

Figure 1A:
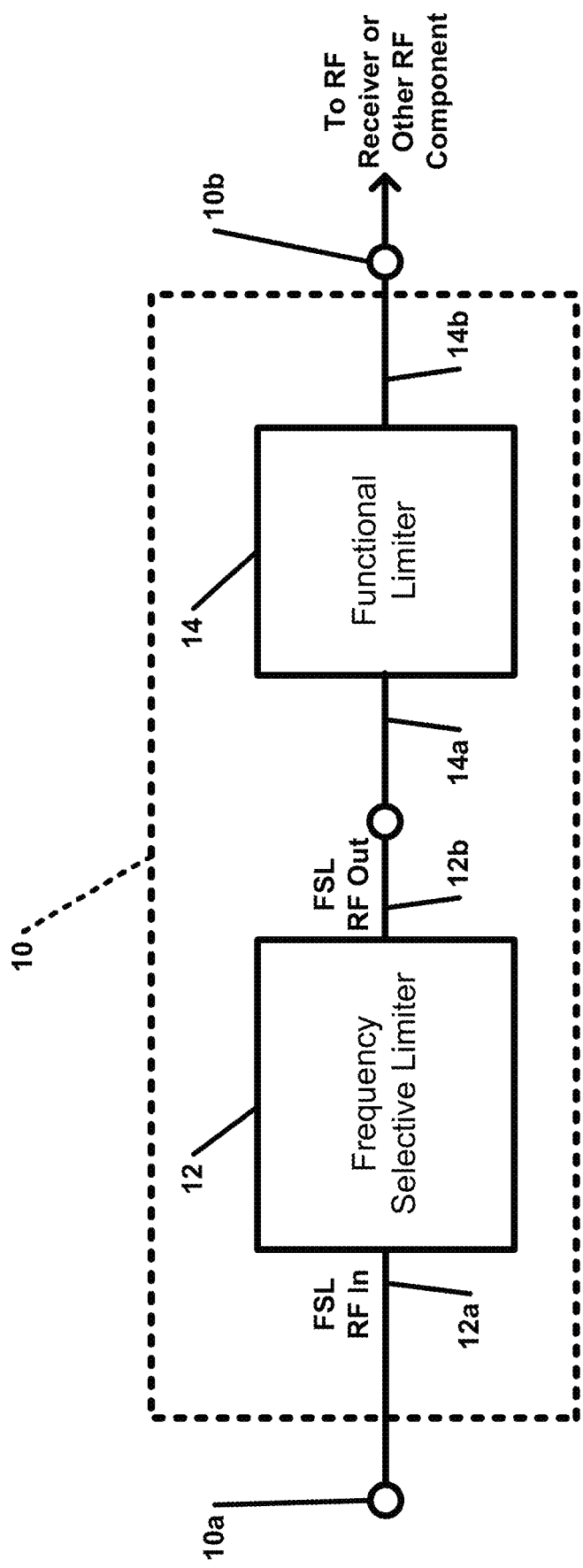
FIG. 1A is a bock diagram of a frequency selective limiter (FSL) module including a frequency selective limiter (FSL) having a limiter serially coupled to an output thereof.

Referring now to FIG. 1A, in one embodiment, an FSL module 10 having an input port 10a and an output port 10b comprises a FSL 12 having a functional limiter 14 coupled in series after the FSL, as shown in FIG. 1A. Functional limiter 14 functions to greatly reduce (and ideally eliminate) spike leakage energy during a transient period of the FSLs 12 response and frequency selective limiting can be achieved when the FSL has reached a steady state response. Thus, the purpose of the functional limiter block is to limit the spike leakage transient. That is, spike leakage is reduced (or ideally minimized or even eliminated) by combining a functional limiter 14 with FSL 12 to provide the FSL module 10 having a reduced (and ideally eliminated) spike leakage characteristic.

In embodiments, the functional limiting block 14 may be provided as a PIN diode limiter cascaded after the FSL. In general, functional limiter 14 may be provided as a traditional PIN diode limiter, a gas discharge device or other power limiting device having the characteristics necessary to reduce (and ideally eliminated) spike leakage. Significantly, it is necessary to carefully coordinate between activation power thresholds for both the FSL and functional limiter technologies to achieve spike-free (or substantially spike-free) performance of the FSL module 10. In general, it is desirable to provide the functional limiter having a power threshold characteristic which is above, but as close as practical, to the steady state limited output power characteristic of the FSL. In particular, and as described in detail hereinbelow, the functional limiter is provided having a power threshold characteristic which is higher than the steady-state limited output power characteristic of the FSL. In embodiments, the functional limiter is provided having a power threshold characteristic which is at least 0.25 dB higher than the steady-state limited output power characteristic of the FSL. In embodiments, the functional limiter is provided having a power threshold characteristic which is in the range of about 0.25 dB to about 2 dB higher than the steady-state limited output power characteristic of the FSL.

Frequency selective limiting ability stems from interactions of RF electromagnetic energy with magnetic spin-waves in high-quality ferrimagnetic materials. Excitation of the magnetic spinwaves typically takes less than 1 µs to reach steady state excitation, depending on supercriticality (i.e. Hrf/Hcrit). This results in "spike leakage" in which some energy goes through the FSL as it is "spinning up", as illustrated in FIG. 2A. As noted, this spike leakage is typically equal to the input power less linear insertion losses (see FIG. 9). For large input signals the spike leakage may harm a receiver system or other system if sufficient energy is deposited on "down-chain" electronics (i.e., electronics coupled to the output side of an FSL). A diagram of the FSL response is shown relative to an input RF pulse in FIG. 2A.

Figure 1B:
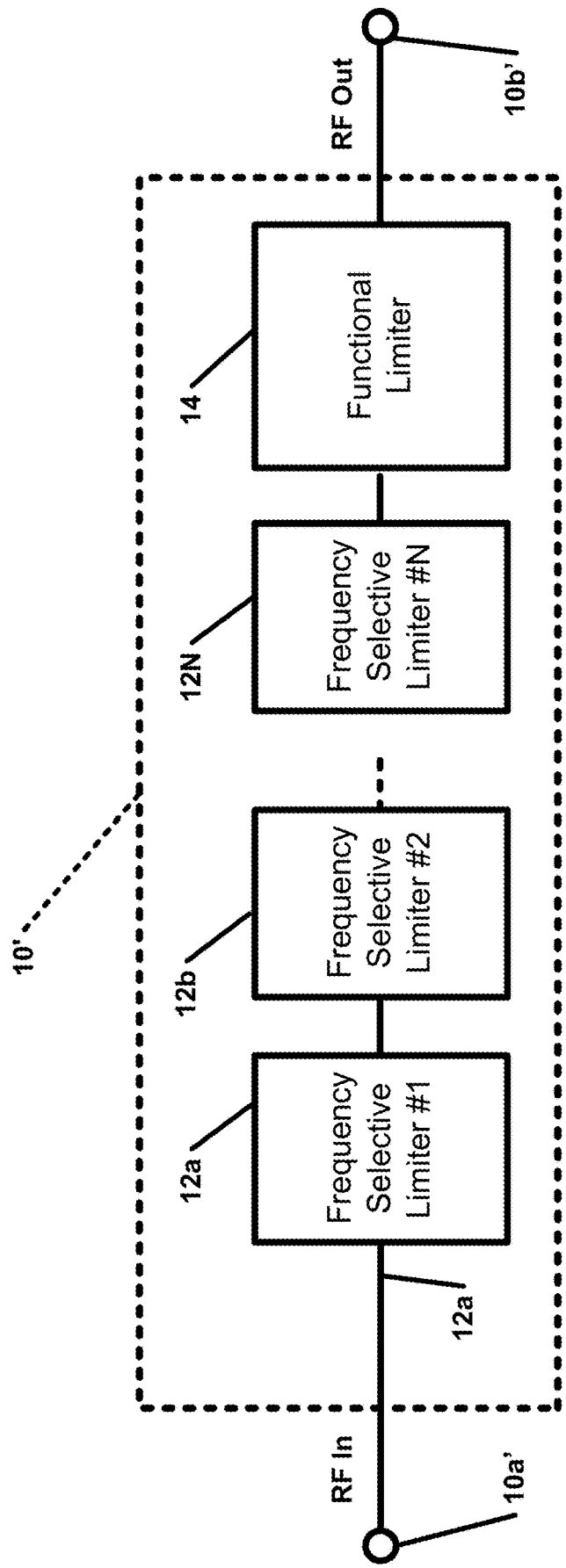
FIG. 1B is a bock diagram of a frequency selective limiter (FSL) module including a plurality of frequency selective limiter (FSL) stages having one or more functional limiters serially coupled to an output thereof.

To reduce (and ideally minimize or even eliminate) spike leakage energy, in accordance with the concepts disclosed herein, described is a method to control FSL transient time response by using a functional limiter in cascade after an FSL as illustrated in FIGS. 1A, 1B. In embodiments, the functional limiter may be provided as a PIN diode limiter. PIN diode limiters are effective in protecting receiver front ends due to extremely fast response time and good power limiting, however, this technology attenuates all signals uniformly, including signals of interest. It is established that the FSL's value is in its ability to discriminate signals based on their power level and only attenuate high-power signals. Since it is desired to take advantage of (and ideally maximize) this characteristic, the FSL and PIN limiter may be combined in such a way that the PIN limiter activates only during the FSL transient time period (see FIGS. 2A-2C). During the steady state time period only the FSL should limit the power rendering the PIN limiter inactive. The concept is illustrated in FIGS. 2A-2C.

Such a characteristic has been demonstrated in an FSL module through experiment, and in accordance with the concepts described herein, it has been shown that: (1) a suitable FSL module can limit high power transients of an FSL and protect down-chain components in the circuit; and (2) in a steady state condition, only the FSL portion of an FSL module will limit the high-power signals and the functional limiter will be inactive (see FIG. 3).

Referring now to FIG. 1B, an FSL module 10' having an input port 10a' and an output port 10b' comprises a plurality of FSLs 12a-12N (e.g., N FSL stages 12a-12N) and one or more a functional limiters 14 (with only one functional limiter being illustrated in FIG. 1B). It should be appreciated that the number of FSL stages may or may not match the number of functional limiter stages. Also, in this example embodiment, the one or more a functional limiters 14 are coupled at or after the output of FSL 12N. In other embodiments, however, it may be desirable to couple one or more of the plurality of functional limiter stages prior to the last FSL stage. Thus, in embodiments comprising a plurality of functional limiter stages, one or more some functional limiter stages may coupled prior to the last FSL stage (in this example, FSL 12N) and one or more functional limiter stages may coupled after the last FSL stage.

As explained above, functional limiters 14 operate to greatly reduce (and ideally eliminate) spike leakage energy during a transient period of the FSLs 12-12N response characteristic and frequency selective limiting can be achieved when the FSLs have reached a steady state response. Thus, spike leakage is reduced or even eliminated by combining a functional limiter 14 having appropriately selected characteristics with one or more FSL stages 12a-12N to provide the FSL module 10' having a reduced (and ideally eliminated) spike leakage characteristic.

In embodiments, the functional limiting block 14 may be provided as a power limiting device coupled to the FSL. Appropriate power limiting devices includes but are not limited to conventional PIN diode limiters, gas discharge devices or other power limiting devices having the characteristics necessary to reduce (and ideally eliminated) spike leakage. As noted above, the function of the functional limiter is to limit the spike leakage transient. As explained above in conjunction with FIG. 1A, it is necessary to carefully coordinate between activation power thresholds for both FSL and limiter technologies to achieve spike-free (or substantially spike-free) performance of the FSL module 10. In operation, the functional limiter is "on" (or active) only for a limited period of time (i.e., during all or a portion of the transient time period Tr) and then the functional limiter becomes inactive (or deactivates or "turns off"). The FSL is "on" (or active) most of the time and in particular is on when functional limiter is "off" (or inactive).

It should be appreciated that that FSLs 12a-12N may or may not all be the same (e.g. all FSLs need not all have the same characteristics). Indeed, in some embodiments, all, some or none of FSLs 12a-12N may be provided as polycrystalline ferrite FSLs while is some embodiments all, some or none of FSLs 12a-12N may be provided as single crystal ferrite FSLs.

In still other embodiments, one or more FSLs 12a-12N may be provided as polycrystalline ferrite FSLs and one or more FSLs 12a-12N may be provided as single crystal ferrite FSLs.

Similarly, it should be appreciated that in embodiments comprising multiple functional limiters 14, the functional limiters 14 may or may not all be the same (e.g. all functional limiters 14 need not all have the same characteristics).

The FSL module configuration of FIG. 1B may result in an FSL module having a limiting dynamic range which is greater than the limiting dynamic range achievable with other configurations (e.g. greater than the limiting dynamic range achievable with a single FSL). Such a limiting dynamic range characteristic may be achieved by cascading one or more polycrystalline ferrite FSLs, with one or more single crystal ferrite FSLs and one or more functional limiters (e.g., a conventional limiter having appropriately selected characteristics in view of the cascaded FSLs whereby the functional limiter is provided having a power threshold which is above a steady state limiting output power of a single FSL or a combination of all FSL stages (some or all of which may be polycrystalline ferrite FSLs and some or all of which may be single crystal ferrite FSLs).

In embodiments, multiple polycrystalline and/or single crystal FSL stages may be employed to achieve a desired limiting dynamic range (i.e. reducing input power by X-dB to achieve Y-dBm output power level).

Also, a low-cost, high-power handling, high dynamic range limiter may be achieved by cascading one or more polycrystalline ferrite FSLs with one or more functional limiters with the functional limiter having a power threshold below the steady-state limited output power of the polycrystalline ferrite FSL. Note that in this embodiment, the frequency selective limiting attribute is sacrificed.

Referring now to FIG. 1C, in one illustrative embodiment, an FSL module 16 having an input port 16a and an output port 16b is provided from a co-planar waveguide FSL 17 comprising a substrate 18 having disposed on a surface thereof a first conductor 19 (corresponding to a signal path conductor also sometimes referred to as a center conductor) arranged between a pair of conductors 20a, 20b (corresponding to ground plane conductors) to thus form a co-planar waveguide transmission line structure. A functional limiter 22 is coupled to an output portion of the FSL 17 and thus functional limiter 22 may be considered as being coupled in series after the FSL. Thus, FSL module 16 is provided as a planar integrated FSL module.

In this example embodiment, functional limiter 22 functions to greatly reduce (and ideally eliminate) spike leakage energy during a transient period of the FSLs 12 response and frequency selective limiting can be achieved when the FSL has reached a steady state response. That is, spike leakage is reduced or even eliminated by combining a limiter 14 as a new functional block with FSL 12 to provide the FSL module 10 having a reduced (and ideally eliminated) spike leakage characteristic. In embodiments, the functional limiting block 14 may be provided as a PIN diode limiter cascaded after the FSL. The function of the limited block is to limit the spike leakage transient. In general, functional limiter 14 may be provided as a traditional PIN diode limiter, a gas discharge device or other power limiting device having the characteristics necessary to reduce (and ideally eliminated) spike leakage. Significantly, and as noted above, it is necessary to carefully coordinate between activation power thresholds for both FSL and limiter technologies to achieve spike-free (or substantially spike-free) performance of the SFSL module 10.

It should be appreciated that although the illustrative FSL module 16 in FIG. 1C is implemented with a CPW FSL, other configurations may also be used, including, but not limited to: double-ridge wave waveguide loaded with ferrites; rectangular waveguide utilizing ferrites; stripline waveguide utilizing the ferrites; substrate-integrated waveguide utilizing ferrites; microstrip (unloaded or loaded) waveguide utilizing ferrites; slotline waveguide utilizing ferrites; and coaxial waveguide utilizing ferrites.

It should be noted that in embodiments, it may be desirable to couple the functional limiter as close as possible to the end of the FSL as this approach may reduce and ideally minimize insertion loss characteristics of an FSL module.

FIG. 2A is a plot of output power response vs. time illustrating transient (Tr) and steady state (Ts) conditions of an FSL (e.g. FSL 12 in FIG. 1). The FSL output power response comprises both transient spike and steady state limiting. In embodiments, in the linear region (i.e., in the steady state time period Ts), the FSL insertion loss is 3 dB. For 40 dBm input power, during transient period Tr, the FSL output power is about 37 dBm and after the transient period Tr period (i.e., during the steady state time period Ts) the FSL output power is about 10 dBm. Transient period starts with the pulse start 30, extends through an increasing insertion loss region 32 and ends where insertion loss saturates at a maximum. Steady state period starts at end of transient period and extends for duration of constant pulse amplitude (region 36);

FIG. 2B is a plot of a PIN diode limiter output power vs. time. In the example of FIG. 2B, the PIN diode Limiter gives 16 dBm hard limiting at input power more than threshold power. Below threshold it gives 1 dB Insertion loss.

FIG. 2C is a plot of output power vs. time for an FSL module (i.e. an FSL integrated with a functional limiter such as a PIN diode limiter). When a pulse of 40 dBm peak power is presented to the input of the FSL module, its output is 37 dBm which is limited by the functional limiter (e.g., a PIN diode limiter) in less than 5 ns to 16 dBm. After the transient time period Tr, the FSL output is 10 dBm and PIN diode limiter deactivates from limiting state. Hence the combined output is 9 dBm (i.e., 10 dBm minus the insertion loss of the PIN diode limiter which in this example is 1 dB). Thus, as can be seen from FIG. 2C, the FSL is "on" (or active) most of the time while the functional limiter is "on" (or active) only during all or a portion of the transient time period Tr and then the functional limiter becomes inactive (or deactivates or "turns off").

Figure 3:
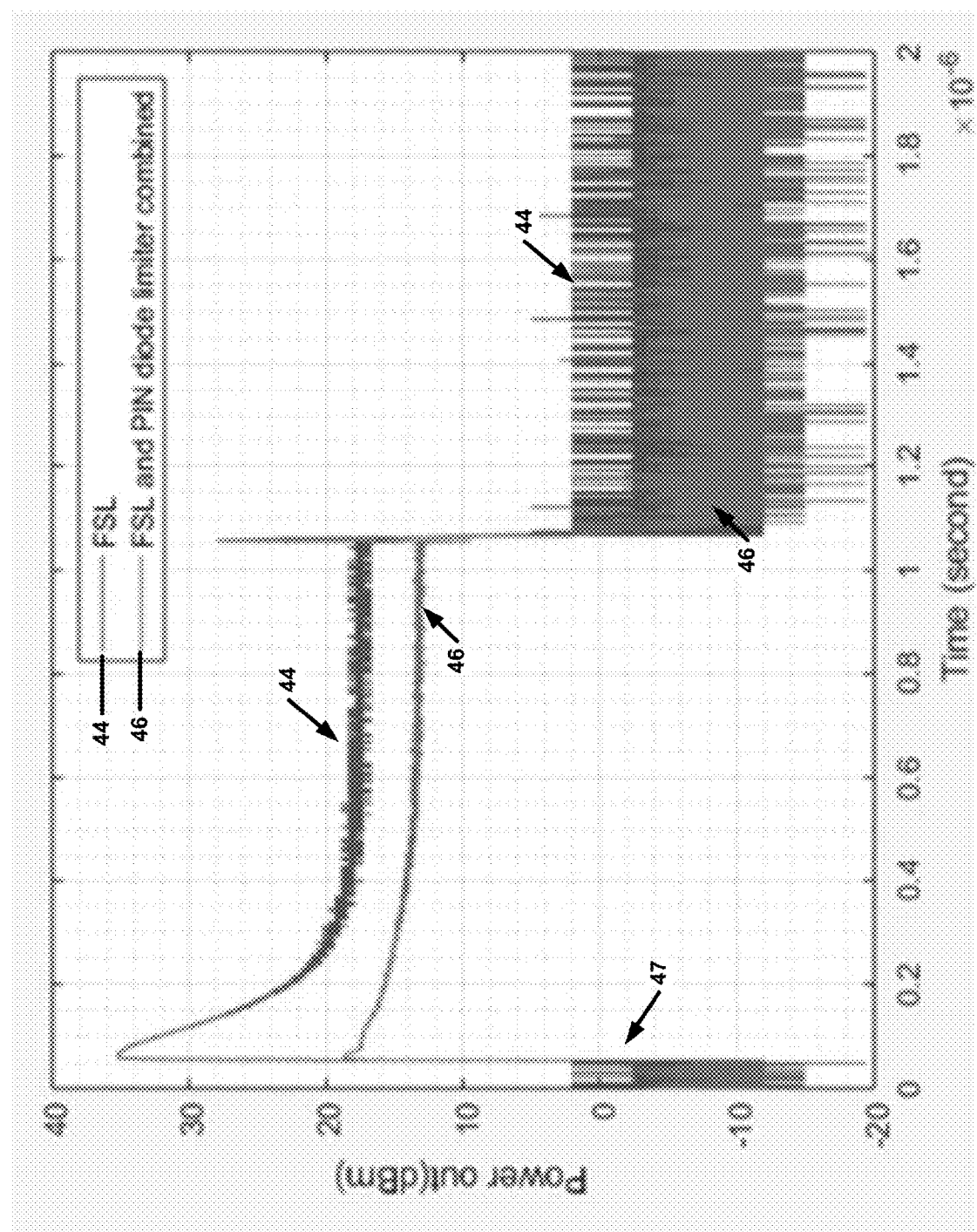
FIG. 3 is a plot of output power vs. time for a conventional FSL and an FSL module comprising a combination of an FSL and a PIN diode limiter.

FIG. 3 is plot having curves 44, 46 which represent two scenarios. Curve 44 corresponds to output power of an FSL only and curve 46 corresponds to output power of an FSL module (i.e., a combination of FSL and functional limiter) such as that described above in conjunction with FIGS. 1A, 1B. In this measurement example, the functional limiter is provided as a PIN diode limiter. Curves 44, 46 in FIG. 3 illustrate a massive reduction in spike leakage in the transient period at the cost of added insertion loss.

Thus, FIG. 3 illustrates the value of using the combination of FSL and functional limiter in the transient region (generally denoted by reference number 47) where significant rejection of the FSL's spike leakage is achieved. As can be seen in FIG. 3, the limiter component and associated interconnects add approximately 2.3 dB of insertion loss. In practical embodiments, the insertion loss can be reduced (i.e., lowered or improved), at least through improved integration of the functional limiter with the FSL (e.g., through improved integration of the functional limiter 14 with the FSL 12 in FIG. 1A). Such improvement may be achieved by the embodiment of FIG. 1C in which diodes 22a, 22b are used to couple center conductor 19 of a co-planar wave guide FSL 17 to respective ones of the co-planar ground planes 20a, 20b.

This cascading approach results in a limiter device (i.e., an FSL module) capable of limiting high power signal (i.e. limiters provided in accordance with the cascade concepts described herein may operate as high power limiters).

Figure 4:
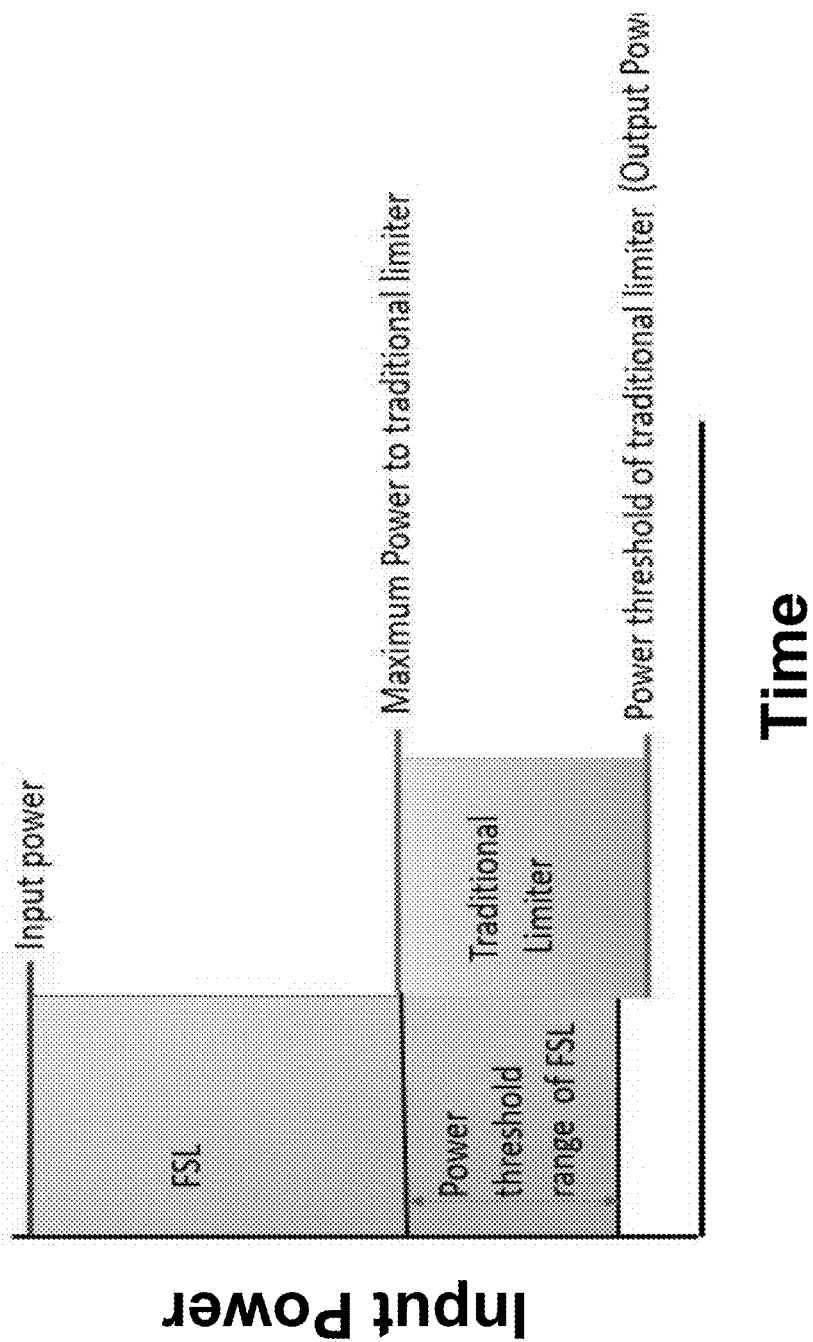
FIG. 4 is a diagram comparing maximum input powers and threshold powers of an FSL limiter and a non-FSL limiter (i.e. a traditional limiter)

In particular, and as illustrated in FIGS. 4, such a limiter module (or cascaded limiter circuit) is able to attenuate signals having very high power (e.g. power levels above about 50 dBm and in some practical embodiments the range of about 50 dBm to about 70 dBm or greater) to signals having very low power (e.g. less than about 15 dBm), if power output of the ferrite FSL in the FSL module is between the lower and upper limits. The lower limit may thus correspond to a power threshold of a functional limiter while the upper limit may correspond to a power threshold of a maximum input power to a functional limiter.

This combination is passive, small size and low cost compared to other available high-power limiters.

Polycrystalline ferrite materials with higher spinwave linewidth offer faster response times and can be used to engineer the spike leakage duration and energy. Also, polycrystalline materials having higher spinwave linewidth are useful for high power applications. Utilizing a combination of polycrystalline and single crystal materials can be done to provide frequency selective limiting over very large dynamic ranges.

Thus, an FSL module having improved response time may be achieved by using polycrystalline ferrite materials that exhibit a spinwave linewidth that is higher (or broader) than single crystal materials. Single crystal garnet materials typically exhibit spinwave linewidths below 1 Oe. Polycrystalline materials exhibiting higher spinwave linewidth (1 to 20 Oe) can be used to realize limiting response times which are faster than limiting response times of FSLs utilizing single crystalline materials.

Figure 5:
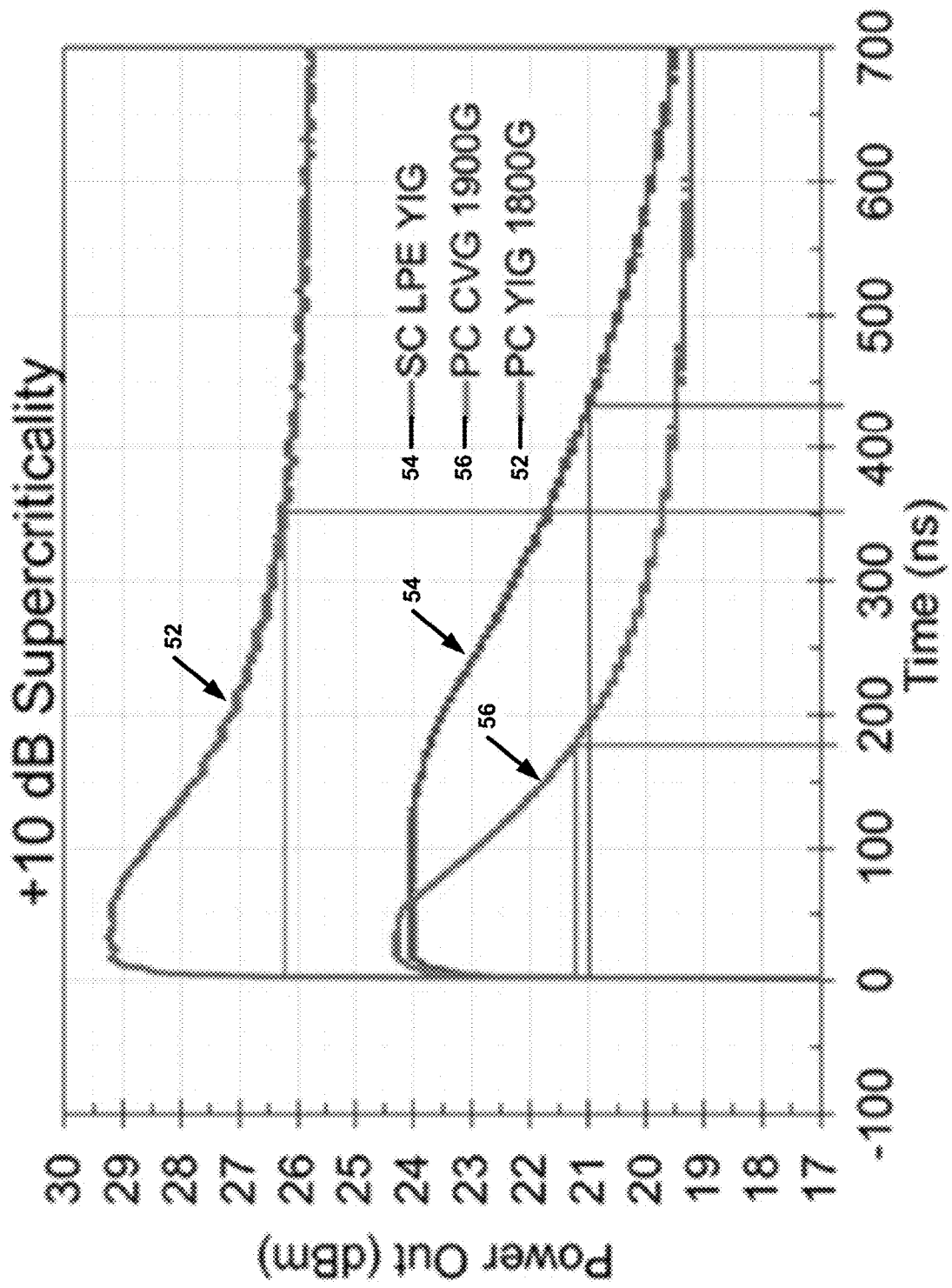
FIG. 5 is a plot of limiter output power vs. time.

In FIG. 5, curve 52, 54, 56 illustrates the output power characteristic vs. time (limiting response times) of example single crystal and polycrystalline materials. In particular curve 52 illustrates the output power characteristic vs. time of a single crystal (SC) LPE YIG material, curve 54 illustrates the output power characteristic vs. time of a polycrystalline (PC) CVG 1900G material and curve 56 illustrates the output power characteristic vs. time of a PC YIG 1800G material. As can be seen from curves 52, 54, 56, polycrystalline materials can be used to realize limiting response times (denoted by the −3 dB point) which are faster than limiting response times of FSLs utilizing single crystalline materials.

In general, spinwave linewidth represents the Q of the material's ability to provide the non-linear response. Lower spinwave linewidth (narrower) results in higher Q and slower response time. Higher spinwave linewidth (broader) results in lower Q and faster response time. Materials can be chosen based upon response time requirements for a particular application.

In embodiments, polycrystalline materials including, but not limited to: TransTech G-113, G-810, G-1010, G-1210, aluminum doped series (G-1009 thru G-610), Calcium Vanadium Doped series (TTVG-800 thru TTZ1950), and Pacific Ceramics 39-1780A, 39-1780B, 39-1780CX may be used. Other ferrite compositions having characteristics which are the same as or similar to those listed above may, of course, also be used.

As noted above, in embodiments, an FSL module having a limiting dynamic range which is greater than the limiting dynamic range of a single FSL may be achieved by cascading polycrystalline ferrite FSL, with a single crystal ferrite FSL and a functional limiter (e.g., a traditional semiconductor limiter). In this case the functional limiter is provided having a power threshold which is above a steady state limiting output power of a single FSL or a combination of all FSL stages (some or all of which may be polycrystalline ferrite FSLs or single crystal ferrite FSLs).

As also noted above, in embodiments (e.g., see FIG. 1B), multiple polycrystalline and/or single crystal FSL stages may be employed to provide an FSL module having a desired limiting dynamic range (i.e. reducing input power by X-dB to achieve Y-dBm output power level).

In embodiments a low-cost, high-power handling, high dynamic range FSL module may be achieved by cascading a polycrystalline ferrite FSL with a functional FSL (e.g., a traditional semiconductor limiter), whereby the power threshold of the functional limiter is below the steady-state limited output power of the polycrystalline ferrite FSL. Note that in this embodiment, frequency selective limiting ability is sacrificed.

Figure 6:
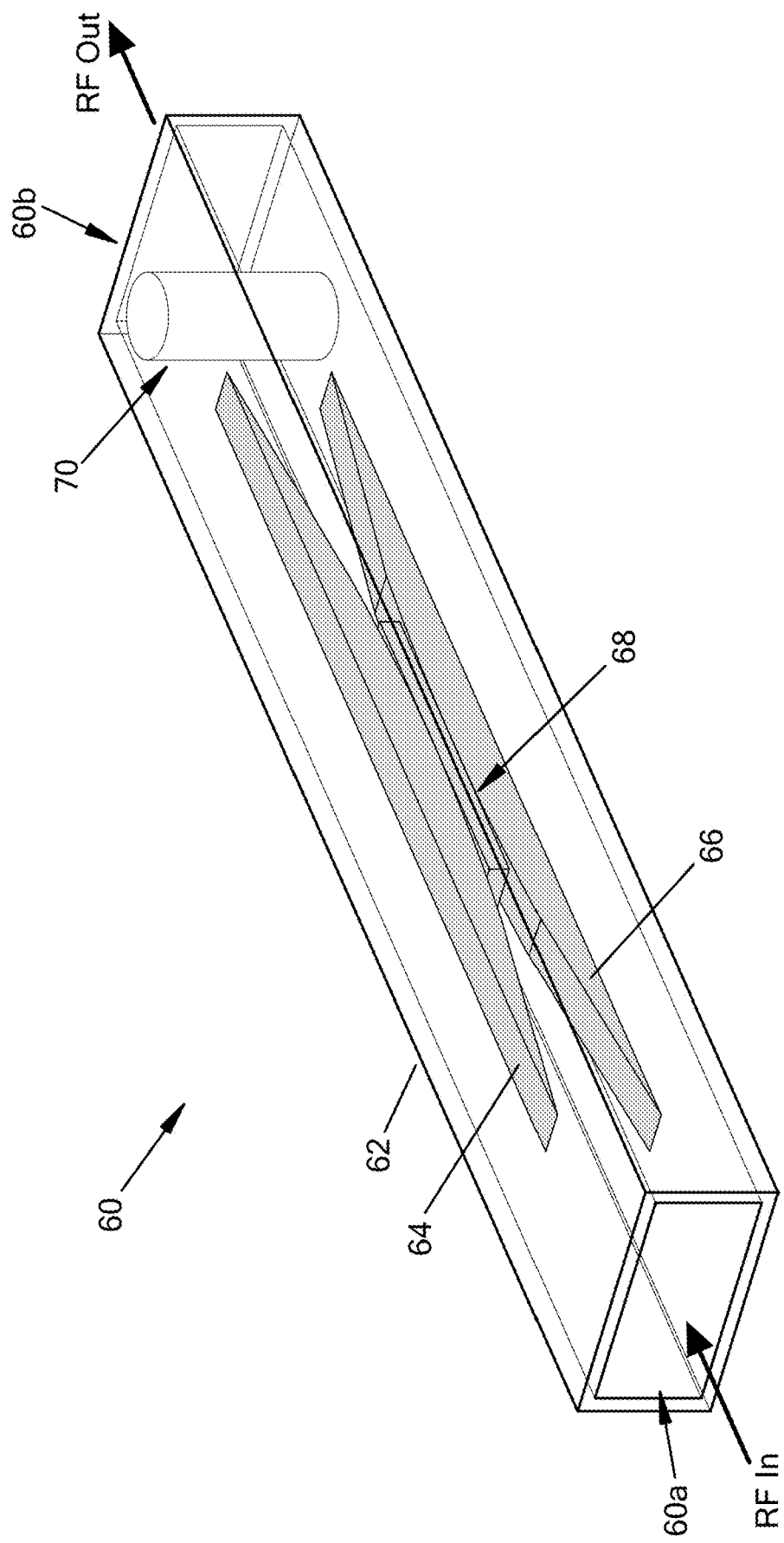
FIG. 6 is an isometric view of an FSL module implemented using a ridged waveguide including an FSL and a functional limiter.

Referring now to FIG. 6, a high-power handling ferrite-based FSL module 60 having an RF input 60a and an RF output 60b comprises a double-ridge waveguide 62 having upper and lower (or top and bottom) ridges 64, 66 and with a ferrite FSL 68 disposed between the ridges (i.e., double-ridge waveguide is loaded with ferrites). In embodiments, the ferrite FSL contacts surfaces of the ridges. The ferrite is provided having a thickness selected in accordance with the threshold power level and power handling requirements of the FSL module 60. A functional limiter 70 is coupled in the waveguide at a waveguide location after the FSL (and which may be at an end of the waveguide e.g. proximate the aperture at FSL module output 60b).

In addition to the CPW FSL module embodiment illustrated in FIG. 1C and the double-ridge waveguide FSL module embodiment illustrated in FIG. 6, in embodiments, a high-power handling ferrite-based FSL module may alternatively be implemented using utilize one or more of: rectangular waveguide utilizing ferrites (including, but not limited to, any of the ferrite materials listed above); stripline waveguide utilizing the ferrites (including, but not limited to, any of the ferrite materials listed above); substrate-integrated waveguide utilizing ferrites (including, but not limited to, any of the ferrite materials listed above); microstrip (unloaded and loaded) waveguide utilizing ferrites; (including, but not limited to, any of the ferrite materials listed above); slotline waveguide utilizing ferrites (including, but not limited to, any of the ferrite materials listed above); and coaxial waveguide utilizing ferrites (including, but not limited to, any of the ferrite materials listed above).

Figure 7:
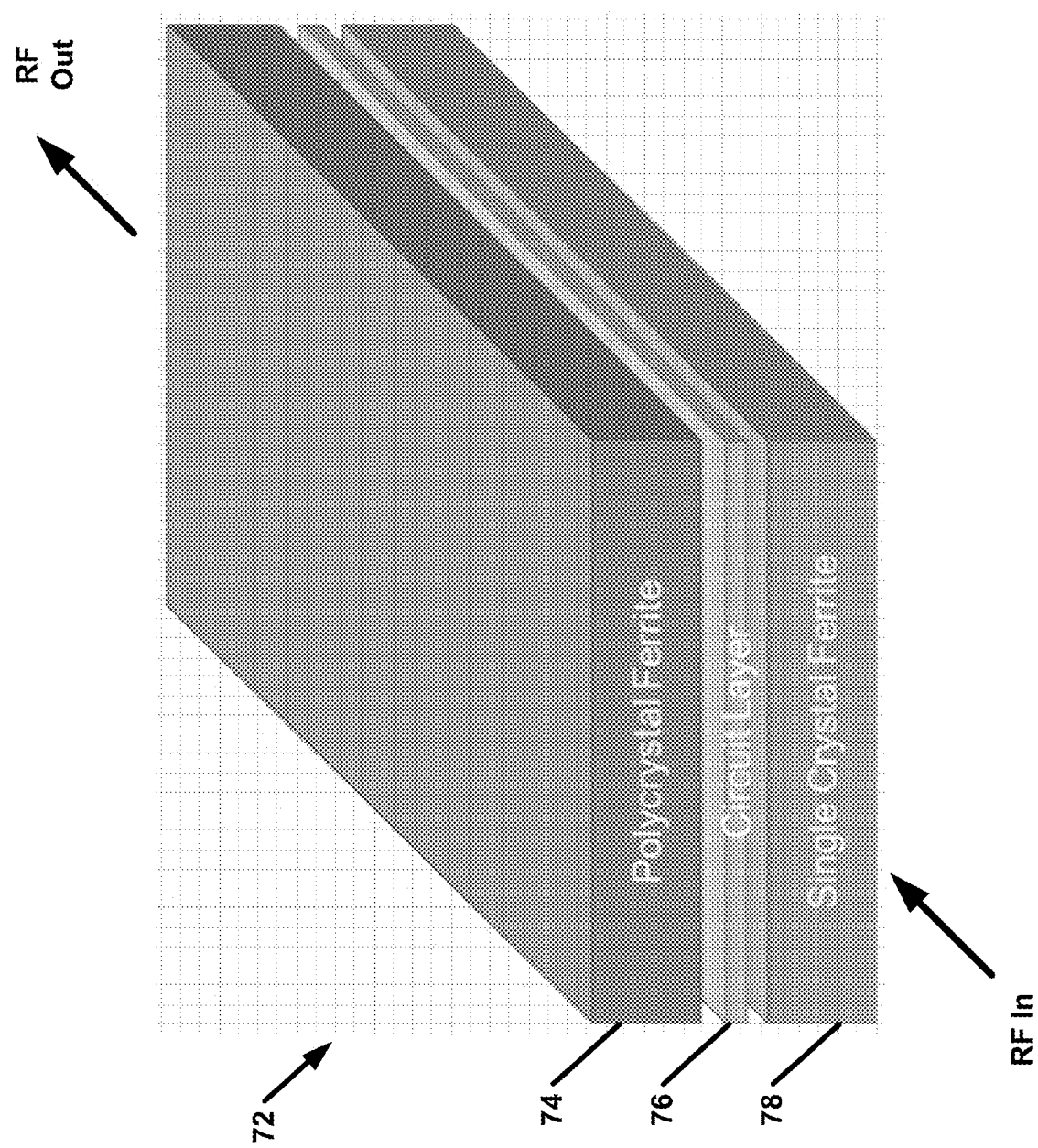
FIG. 7 is an isometric view of a hybrid ferrite-based FSL module comprising polycrystalline and single crystal materials used in parallel.

Referring now to FIG. 7, a hybrid ferrite-based FSL module 72 includes an FSL comprising polycrystalline and single crystal materials (or substrates) 74, 78 disposed about a circuit layer 76 comprising a functional limiter. The functional limiter is disposed proximate an output port of the FSL module 72. The FSL circuit layer 76 disposed between a first surface of the single crystal FSL substrate 78 and a first surface of the polycrystalline FSL substrate 74, The FSL circuit configured such that an electromagnetic EM wave provided to an input of the FSL module simultaneously propagates in both the single crystal FSL substrate and the polycrystalline FSL substrate. In embodiments, the FSL circuit comprises a co-planar waveguide (i.e. CPW) such that the EM wave propagates in both materials 74, 78 simultaneously and is processed by both materials differently. The result of this topology is to achieve fast limiting response time (provided by polycrystalline ferrite) and lower limiting thresholds (provided by single crystal ferrite) in parallel (i.e. simultaneously). This can result in a smaller ferrite FSL and potentially reduce the number of FSL stages for embodiments in FIG. 1B.

Such an arrangement may be achieved in an assembly process whereby a single crystal and polycrystalline material may be on either side of the FSL circuit (e.g., a coplanar waveguide circuit) such that the EM wave propagates in both materials simultaneously and is processed by both materials differently.

Figure 8:
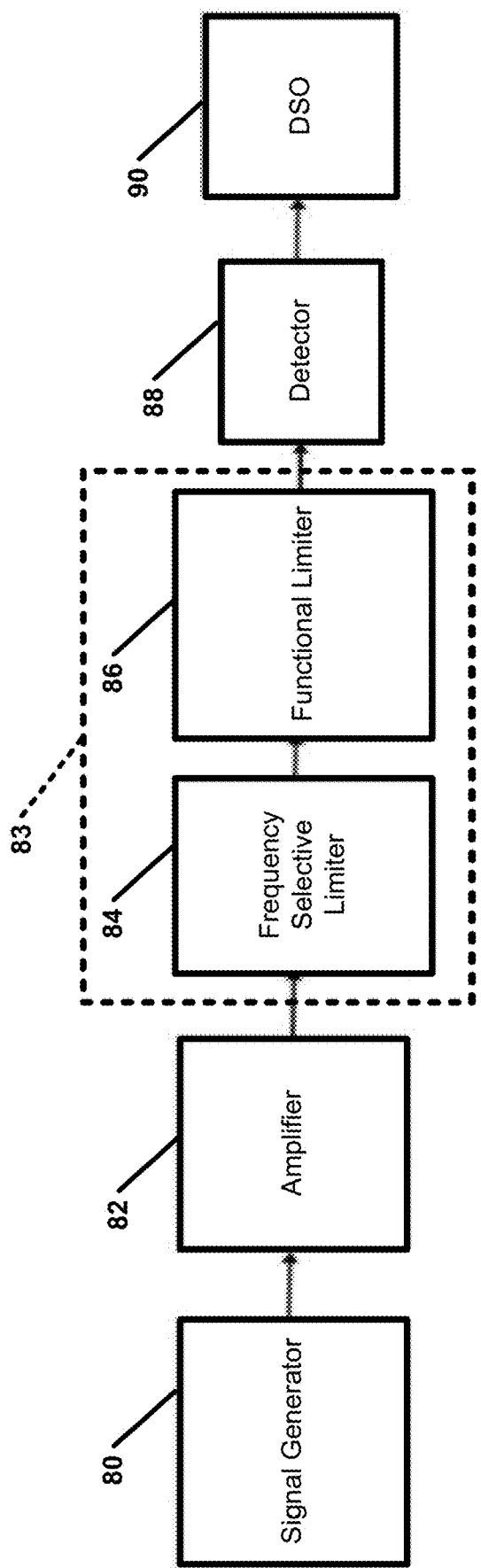
FIG. 8 is a block diagram of a system for measuring a time response of an FSL module comprising an FSL integrated with a PIN diode limiter.

Referring now to FIG. 8, a system for measuring a response characteristic of an FSL module includes a signal generator 80 which provides an RF signal to an input of an RF amplifier 82. An output of RF amplifier 82 is coupled to an input of an FSL module 83 comprising an FSL 84 integrated with a functional limiter 86. The signal generator and RF amplifier may be controlled to provide RF signals at desired power levels to the input of FSL module 83. An output of FSL module 83 is coupled to a detector 88 which measures power of the RF signal provided thereto from the output of the FSL module. An output of detector 88 is coupled to a digital storage oscilloscope (DSO) 90 which acquires and stores waveforms provided thereto.

Figure 9:
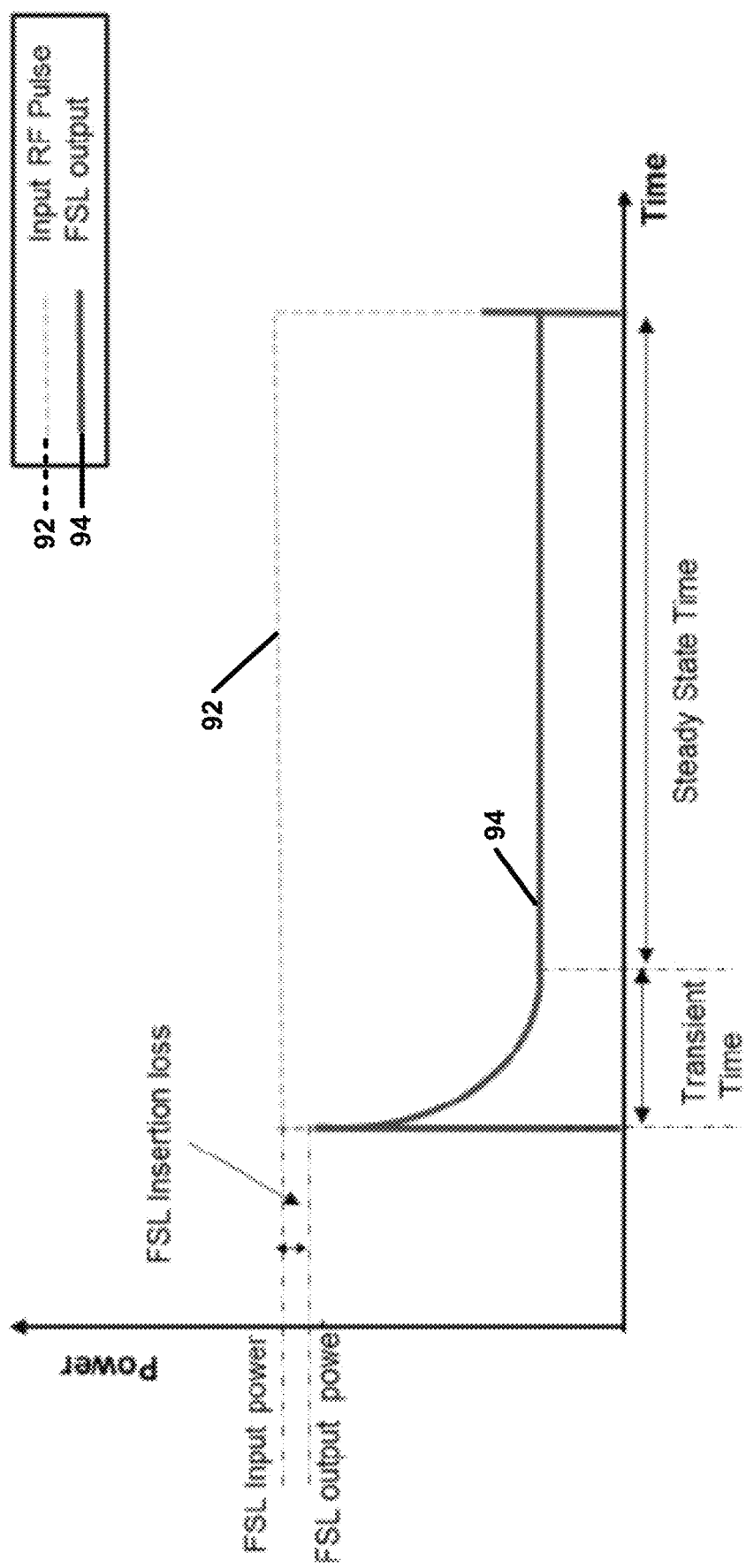
FIG. 9 is a plot of FSL output power vs. time which illustrates that spike leakage is typically equal to the input power less linear insertion losses of the FSL.

Referring now to FIG. 9, a plot of output power vs. time for an FSL (e.g., FSL 84 in FIG. 8). Curves 92 represents the power level of an input RF pulse vs. time while curve 94 represents an FSL output power level. Curves 92, 94 thus illustrate that spike leakage is typically equal to the input power less linear insertion losses.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the above description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to disposing or otherwise positioning element "A" over element "B" include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. As used herein, the terms "comprise," "comprises," "comprising, "include," "includes," "including," "has," "having," "contains" or "containing," or any other variation thereof, are intended to cover a non-exclusive inclusion. For example, an apparatus, a method, a composition, a mixture or an article, that comprises a list of elements is not necessarily limited to only those elements but can include other elements not expressly listed or inherent to such apparatus, method, composition, mixture, or article.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "embodiments," "one embodiment, "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, relative or positional terms including but not limited to the terms "upper," "lower," "right," "left," "vertical," "horizontal, "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways.

Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

Accordingly, it is submitted that that scope of the patent should not be limited to the described implementations but rather should be limited only by the spirit and scope of the following claims.

All publications and references cited herein are expressly incorporated herein by reference in their entirety.

What is claimed is:

1. A frequency selective limiter (FSL) module comprising:
   a radio frequency (RF) ferrite-based FSL having an input, an output and a steady-state limited output power characteristic; and
   an RF functional limiter coupled to an output of the ferrite-based FSL, wherein the RF functional limiter is a semiconductor limiter.

2. The FSL module of claim 1 wherein the RF functional limiter comprises a plurality of semiconductor limiters.

3. The FSL module of claim 1 wherein the RF functional limiter has a power threshold characteristic which is higher than the steady-state limited output power characteristic of the RF ferrite-based FSL.

4. The FSL module of claim 1 wherein the RF functional limiter has a power threshold characteristic which is at least 0.25 dB higher than the steady-state limited output power characteristic of the RF ferrite-based FSL.

5. The FSL module of claim 1 wherein the RF ferrite-based FSL comprises a plurality of coupled RF ferrite-based FSLs.

6. The FSL module of claim 1 wherein the RF ferrite-based FSL comprises a plurality of serially coupled RF ferrite-based FSLs.

7. The FSL module of claim 1 wherein the RF ferrite-based FSL is one of:
   a polycrystalline ferrite FSL; and
   a single crystal ferrite FSL.

8. The FSL module of claim 1 wherein the RF functional limiter is a PIN diode limiter.

9. A frequency selective limiter (FSL) module comprising:
   a radio frequency (RF) ferrite-based FSL having an input and an output; and
   an RF functional limiter coupled to an output of the ferrite-based FSL, wherein the functional limiter is a gas discharge device.

10. The FSL module of claim 9 wherein the RF functional limiter comprises a plurality of gas discharge devices.

11. The FSL module of claim 9 wherein the RF functional limiter has a power threshold characteristic which is higher than a steady-state limited output power characteristic of the RF ferrite-based FSL.

12. The FSL module of claim 9 wherein the RF functional limiter has a power threshold characteristic which is at least 0.25 dB higher than a steady-state limited output power characteristic of the RF ferrite-based FSL.

13. The FSL module of claim 9 wherein the RF ferrite-based FSL comprises a plurality of coupled ferrite-based FSLs.

14. The FSL module of claim 9 wherein the RF ferrite-based FSL comprises a plurality of serially coupled RF ferrite-based FSLs.

15. A frequency selective limiter (FSL) module comprising:
   a radio frequency (RF) ferrite-based FSL stage having a spike leakage characteristic; and
   an RF functional limiter stage coupled to an output of the ferrite-based FSL stage, wherein characteristics of the RF ferrite-based FSL stage and the RF functional limiter stage are selected such that the combination of the RF functional limiter stage and the RF ferrite-based FSL stage provide the FSL module having a spike leakage characteristic which is reduced compared with the spike leakage characteristic of the RF ferrite-based FSL stage.

16. The FSL module of claim 15 wherein the RF functional limiter has a power threshold characteristic which is higher than a steady-state limited output power characteristic of the RF ferrite-based FSL stage.

17. The FSL module of claim 15 wherein the RF functional limiter stage comprises a plurality of RF functional limiters.

18. The FSL module of claim 15 wherein the RF functional limiter stage comprises at least one of:
   a semiconductor diode;
   a PIN diode; and
   a gas discharge device.

19. The FSL module of claim 15 wherein the RF ferrite-based FSL stage comprises a plurality of RF ferrite-based frequency selective limiters.

20. A frequency selective limiter (FSL) module having an FSL module input and an FSL module output, the FSL module comprising:
   one or more FSL stages, each of the one or more FSL stages comprising a ferrite and having an FSL stage input, an FSL stage output and a steady-state limited output power characteristic; and
   one or more radio frequency (RF) functional limiter stages, each of the one or more RF functional limiter stages coupled to an output of at least one of the one or more FSL stages.

21. The FSL module of claim 20 wherein each of the one or more RF functional limiter stages has a power threshold characteristic which is higher than the steady-state limited output power characteristic of the one or more FSL stages.

22. The FSL module of claim 20 wherein the number of FSL stages does not match the number of RF functional limiter stages.

23. The FSL module of claim 20 wherein the number of FSL stages matches the number of RF functional limiter stages.

24. The FSL module of claim 20 wherein the one or more RF functional limiter stages are coupled at or after the output of the last FSL stage.

25. The FSL module of claim 20 wherein one or more of the plurality of RF functional limiters are coupled to an output of an FSL stage prior to the last FSL stage.

26. The FSL module of claim 20 wherein the FSL module comprises a plurality of RF functional limiters with at least some of the plurality of RF functional limiters coupled to one or more FSL stages prior to the last FSL stage.

27. The FSL module of claim 26 wherein at least one of the one or more RF functional limiter stages is coupled to an output of the last FSL stage.

28. The FSL module of claim 20 wherein at least one of the one or more RF functional limiter stages is coupled to an output of the FSL module.

29. A frequency selective limiter (FSL) module comprising:
   a radio frequency (RF) ferrite-based FSL having an input, an output and a steady-stage limited output power characteristic; and
   at least one RF functional limiter stage integrated with the RF ferrite-based FSL.

30. The FSL module of claim 29 wherein the FSL module is provided as a planar integrated FSL module.

31. The FSL module of claim 29 wherein at least one of the at least one integrated RF functional limiter stages comprises at least one of:
   a semiconductor diode; and
   a PIN diode.

\* \* \* \* \*